(12) United States Patent
Chen et al.

(10) Patent No.: US 11,178,792 B1
(45) Date of Patent: Nov. 16, 2021

(54) HEAT EXCHANGE STRUCTURE OF TELECOMMUNICATION CABINET

(71) Applicant: SUPER MICRO COMPUTER, INC., San Jose, CA (US)

(72) Inventors: Chia-Wei Chen, Taipei (TW); Tienen Chao, San Jose, CA (US)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 17/161,336

(22) Filed: Jan. 28, 2021

(51) Int. Cl.
*G06F 1/16* (2006.01)
*H05K 5/00* (2006.01)
*H05K 7/00* (2006.01)
*H05K 7/20* (2006.01)
*H05K 7/18* (2006.01)

(52) U.S. Cl.
CPC ......... *H05K 7/20572* (2013.01); *H05K 7/186* (2013.01)

(58) Field of Classification Search
CPC ........... H05K 7/20572; H05K 7/20581; H05K 7/20563; H05K 7/20554; H05K 7/20536; H05K 7/2059; H05K 7/20618; H05K 7/186; H05K 7/183; H05K 7/18
See application file for complete search history.

(56) References Cited

U.S. PATENT DOCUMENTS

| | | | | |
|---|---|---|---|---|
| 10,212,861 | B2 * | 2/2019 | Ashbaugh | H05K 7/20909 |
| 10,874,036 | B2 * | 12/2020 | Yang | H04Q 1/035 |
| 2008/0055848 | A1 * | 3/2008 | Hamburgen | G06F 1/20 361/691 |
| 2010/0253189 | A1 * | 10/2010 | Ji | H05K 7/20572 312/236 |
| 2011/0240327 | A1 * | 10/2011 | Hasegawa | H05K 5/06 174/50.54 |
| 2013/0219947 | A1 * | 8/2013 | Yang | H05K 7/20609 62/426 |
| 2016/0302326 | A1 * | 10/2016 | Chen | H05K 7/20618 |
| 2020/0275584 | A1 * | 8/2020 | Chiang | H05K 7/20736 |

* cited by examiner

*Primary Examiner* — Anthony M Haughton
(74) *Attorney, Agent, or Firm* — Patrick D. Benedicto

(57) ABSTRACT

A telecommunication cabinet includes a first and a second cabinet bodies, an internal fan, a partition board, multiple heat dissipation pipes and an external fan. The first cabinet body includes an upper slot and a lower slot. The second cabinet body covers the first cabinet body and includes an air inlet and an air outlet. The internal fan is arranged in the first cabinet body. The partition board is connected with the second cabinet body and includes multiple air vents and multiple air intakes. The heat dissipation pipes are disposed in the second cabinet body and include multiple upper nozzles and multiple lower nozzles. Multiple heat dissipation channels are disposed between the heat dissipation pipes. The external fan is disposed on a bottom inside the second cabinet body.

9 Claims, 7 Drawing Sheets

HEAT EXCHANGE STRUCTURE OF TELECOMMUNICATION CABINET

BACKGROUND OF THE INVENTION

Technical Field

The technical field relates to a telecommunication cabinet, and more particularly relates to a heat exchange structure of a telecommunication cabinet.

Description of Related Art

The millimeter wave used by 5G technology is susceptible to interference and interruption, so a larger number of small cells must be deployed to achieve requisite coverage. In addition, small cells are usually deployed in densely populated metropolitan areas where demand is greatest. In order to reduce the amount of space occupied and avoid interference or interruption, current plans for 5G base stations call for installation in high places such as telecommunication poles, signal poles, street lamp poles, or elevated bridges.

Since small cells are usually deployed outdoors, preventing the intrusion of moisture or dust into the small cells is a significant concern. Furthermore, 5G base stations have high power consumption than their 4G counterparts, so the heat generated by the heating elements within the cabinet needs to be effectively dissipated to maintain normal operations. The existing design of heat exchangers used in 5G telecommunication cabinets utilizes multiple internal fans, which occupy a large volume of internal space and increase the difficulty of optimizing the use of the internal space of the cabinet. Additionally, the aforementioned heat exchanger is often designed with wind turning that is likely to generate airflow resistance and cause heat accumulation.

In view of the above drawbacks, the inventor proposes this disclosure based on his expert knowledge and elaborate research in order to solve the problems in the prior art.

SUMMARY OF THE INVENTION

It is an objective of this disclosure to provide a heat exchange structure of a telecommunication cabinet that optimizes the internal space of the cabinet, reduces airflow resistance, and improves heat dissipation efficiency.

In order to achieve the objective mentioned above, this disclosure provides a heat exchange structure of a telecommunication cabinet including a first cabinet body, a second cabinet body, at least one internal fan, a partition board, a plurality of heat dissipation pipes, and at least one external fan. The first cabinet body includes an upper slot and a lower slot. The second cabinet body covers the first cabinet body and includes an air inlet and an air outlet. The internal fan is arranged in the first cabinet body and is adjacent to the upper slot. The partition board is connected with the second cabinet body, blocks the first cabinet body from communicating with the second cabinet body, and includes a plurality of air vents and a plurality of air intakes, where the air vents are arranged correspondingly above the air intakes. The heat dissipation pipes are disposed in the second cabinet body and are arranged spacedly and extended longitudinally. A plurality of heat dissipation channels is thus formed between two adjacent heat dissipation pipes. The heat dissipation pipes include a plurality of upper nozzles to correspondingly connect the air vents and a plurality of lower nozzles to correspondingly connect the air intakes. The external fan is disposed on a bottom position inside the second cabinet body. Hot air flows out from the first cabinet body through the lower slot under forcible airflow from the internal fan, and enters the lower nozzles of the heat dissipation pipes through the air intakes of the partition board. The hot air flows out from the upper nozzles and passes through the air vents of the partition board, flows through the heat dissipation pipes and performs heat exchange, and enters the first cabinet body through the upper slot. External air enters the second cabinet body from the air inlet under forcible airflow from the external fan, flows through the heat dissipation channels to perform heat exchange with the heat dissipation pipes, and flows out from the second cabinet body through the air outlet to an outside.

It is another objective of this disclosure to provide a heat exchange structure of a telecommunication cabinet in which the flow path of the hot air inside the first cabinet body and the flow path of the external air inside the second cabinet are two independent paths that do not intervene with each other. The first cabinet body and the second cabinet may therefore be isolated, so that the first cabinet body is both dustproof and waterproof.

Comparing to the related art, the heat exchange structure of the telecommunication cabinet of this disclosure utilizes independent flow paths for hot air and external air to improve dustproofing and waterproofing. Additionally, since the hot air and the external air flow through the heat dissipation pipes in linear paths, the air flows do not suffer increased air resistance due to turns or bends in the flow path. Therefore, the heat exchange efficiency and heat dissipation effect are improved. Moreover, by optimizing the use of internal space within the telecommunication cabinet, the telecommunication cabinet may more easily be mounted at higher elevations, which not only saves on ground space but also minimizes interference to the millimeter wave emitted from the telecommunication cabinet.

BRIEF DESCRIPTION OF DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION OF THE EMBODIMENTS

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
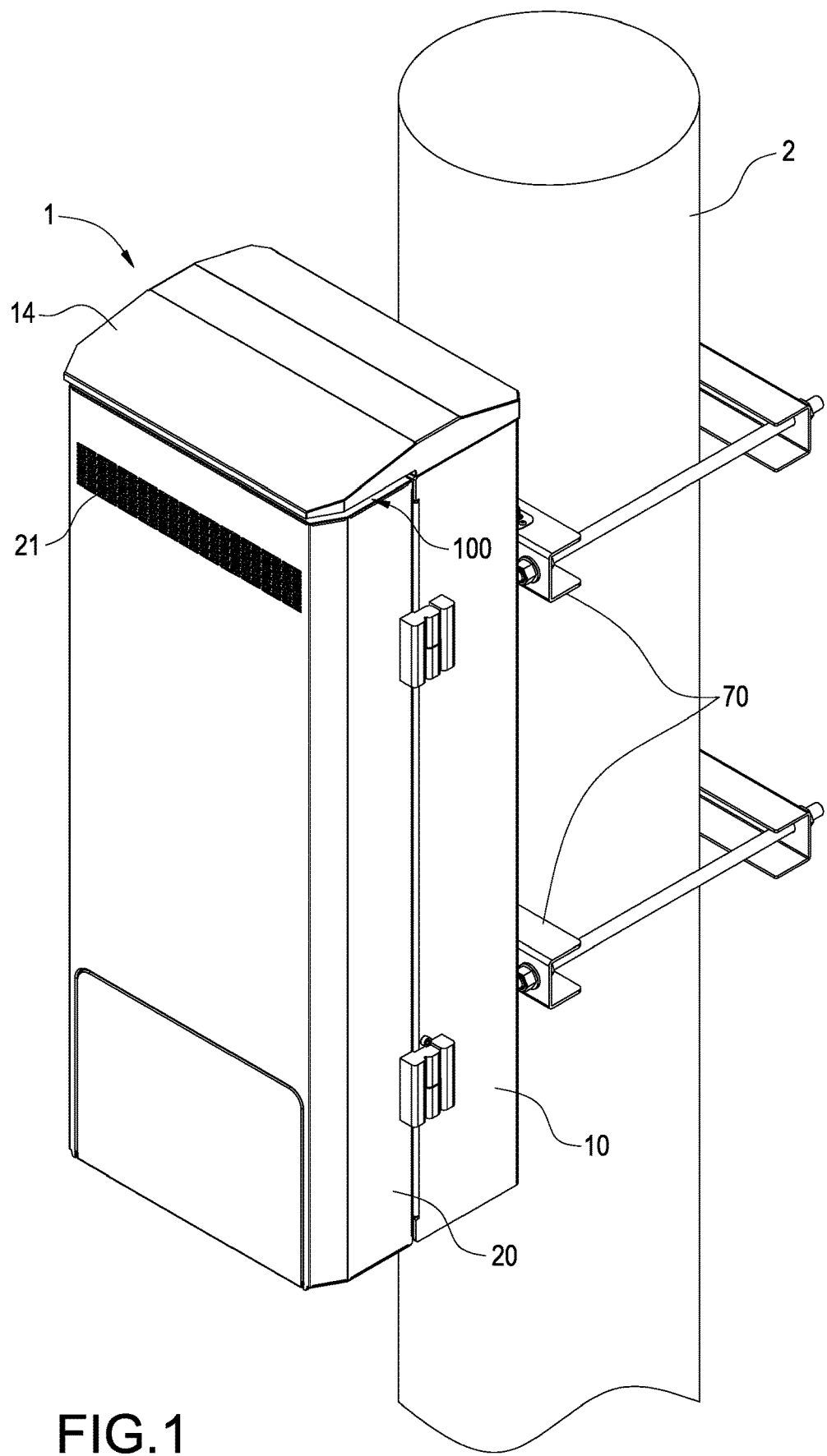
FIG. 1 is a schematic view of the telecommunication cabinet in an operation status of this disclosure.
Figure 2:
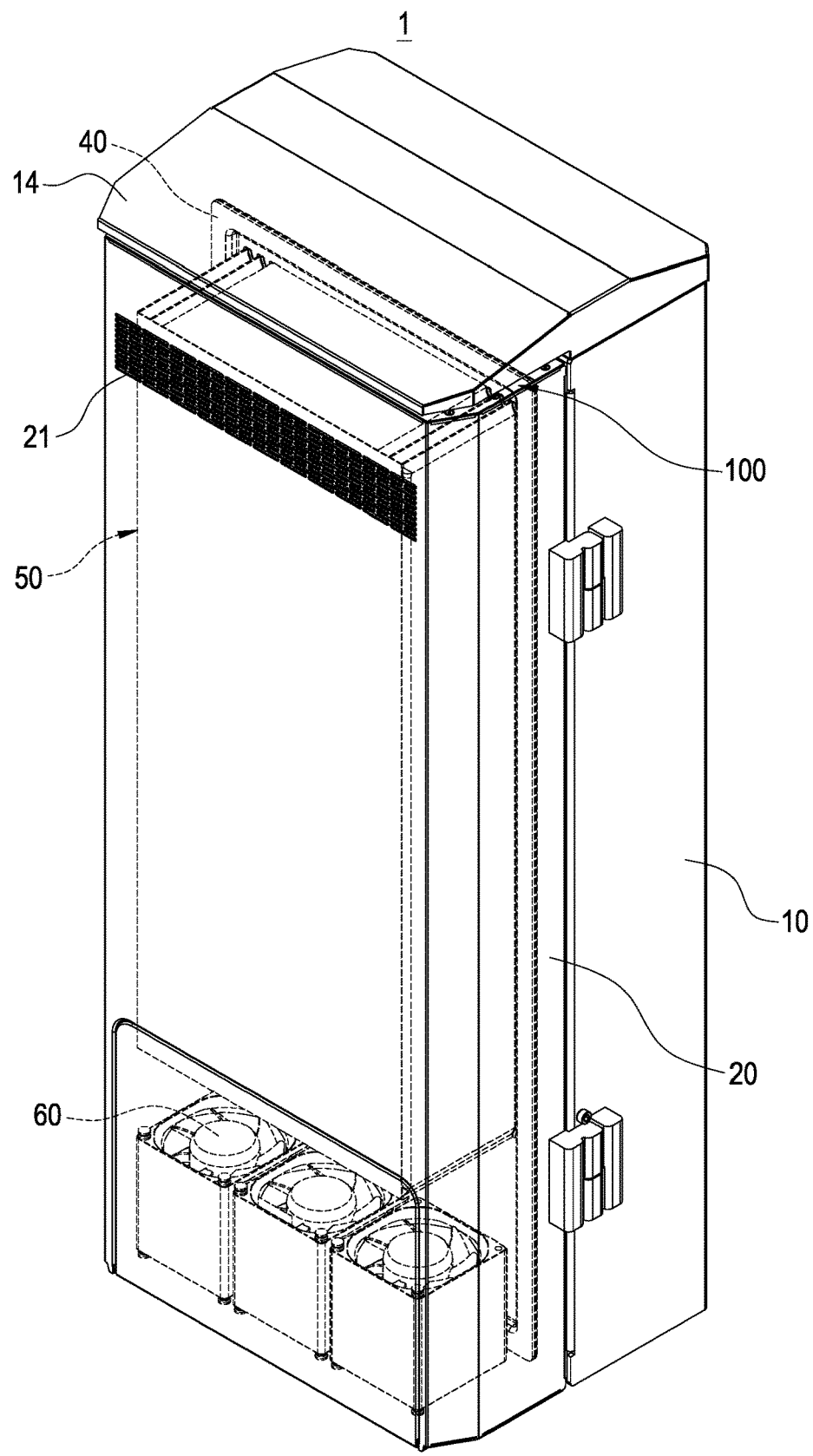
FIG. 2 is a perspective schematic view of the telecommunication cabinet of this disclosure.
Figure 3:
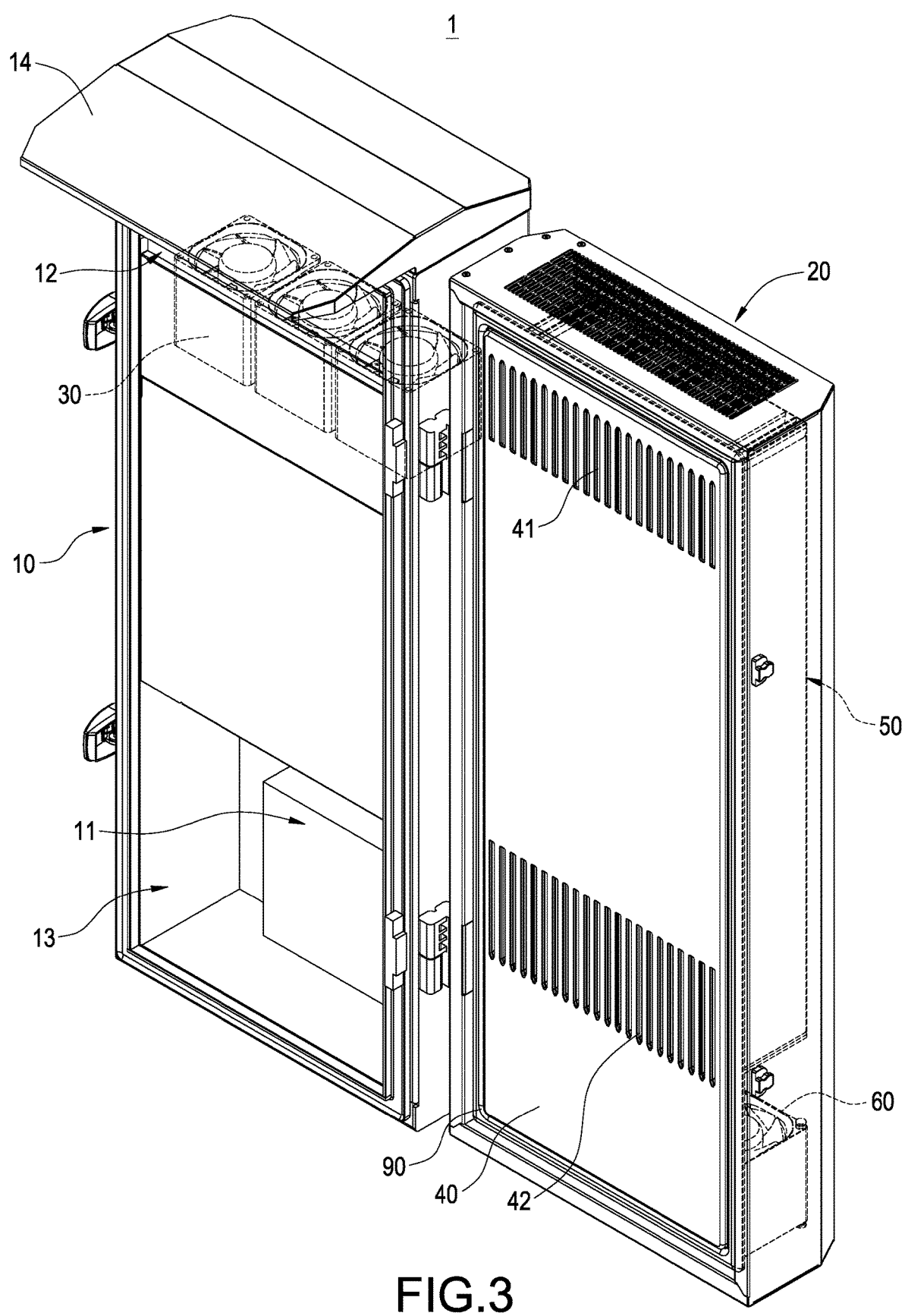
FIG. 3 is a perspective schematic view of the second cabinet body being opened of this disclosure.

Please refer to FIG. 1 to FIG. 3, which depict a schematic view of the telecommunication cabinet in an operation status of this disclosure, a perspective schematic view of the telecommunication cabinet of this disclosure and a perspective schematic view of the second cabinet body being opened of this disclosure. The heat exchange structure of the telecommunication cabinet 1 of this disclosure includes a first cabinet body 10, a second cabinet body 20, at least one internal fan 30, a partition board 40, a plurality of heat dissipation pipes 50 and at least one external fan 60. The internal fan 30 is disposed in the first cabinet body 10. The partition board 40, the heat dissipation pipes 50 and the external fan 60 are disposed in the second cabinet body 20. The telecommunication cabinet 1 is configured by the second cabinet body 20 covering the first cabinet body 10 correspondingly.

Please refer to FIG. 1. In one embodiment of this disclosure, the telecommunication cabinet 1 further includes a pair of brackets 70. The pair of the brackets 70 are connected to a rear side of the first cabinet body 10, and the telecommunication cabinet 1 is attached to a fixed object 2 through the pair of brackets 70. The fixed object 2 may be a supporting pole, such as a telecommunication pole, a signal pole, a street lamp pole, or an elevated bridge, etc. Therefore, the telecommunication cabinet 1 need not occupy ground space, and the millimeter waves emitted from the telecommunication cabinet 1 may be protected from interference from other electronic devices or blocking by the building.

Please refer to FIG. 3, a telecommunication module 11 is arranged inside the first cabinet body 10. In some embodiments, a plurality of telecommunication modules 11 are arranged in the first cabinet body 10, and the first cabinet body 10 is substantially of a rectangular shape. Moreover, the telecommunication modules 11 may be the network communication modules including power amplifier, switching rectifier, splitter, power converter and other electronic component, and the aforementioned components may be arranged accordingly. In this embodiment, the first cabinet body 10 includes an upper slot 12 and a lower slot 13. In addition, the first cabinet body 10 includes a convex plate 14 disposed on a top of the first cabinet body 10. The convex plate 14 is protruded to an upper side of the second cabinet body 20, and a gap 100 is disposed between the convex plate 14 and the second cabinet body 20 (see also FIG. 1).

Please refer to FIG. 2 and FIG. 3, the second cabinet body 20 covers the first cabinet body 10 correspondingly, and the second cabinet body 20 includes an air inlet 21 and an air outlet 22. In some embodiments, a plurality of second air inlets 23 are disposed on the top surface of the second cabinet body 20. Therefore, the external air enters the second air inlets 23 through the air inlet 21 or the gap 100 and flows into the second cabinet body 20.

The internal fan 30 is arranged in the first cabinet body 10 and is adjacent to the upper slot 12. In this embodiment, the number of the internal fan 30 is multiple, and the multiple internal fans 30 are axial fans respectively.

The partition board 40 is connected with the second cabinet body 20 and blocks the first cabinet body 10 from communicating with the second cabinet body 20. Additionally, the partition board 40 includes a plurality of air vents 41 and a plurality of air intakes 42, and the air vents 41 are arranged above the air intakes 42 correspondingly.

Moreover, the heat dissipation pipes 50 are disposed in the second cabinet body 20. In some embodiments, each heat dissipation pipe 50 is a hollow pipe. The structure of the heat dissipation pipes 50 is described in more detail as below.

The external fan 60 is disposed on a bottom inside the second cabinet body 20. In this embodiment, the number of the external fan 60 is multiple, and the multiple external fans 60 are axial fans respectively.

Figure 4:
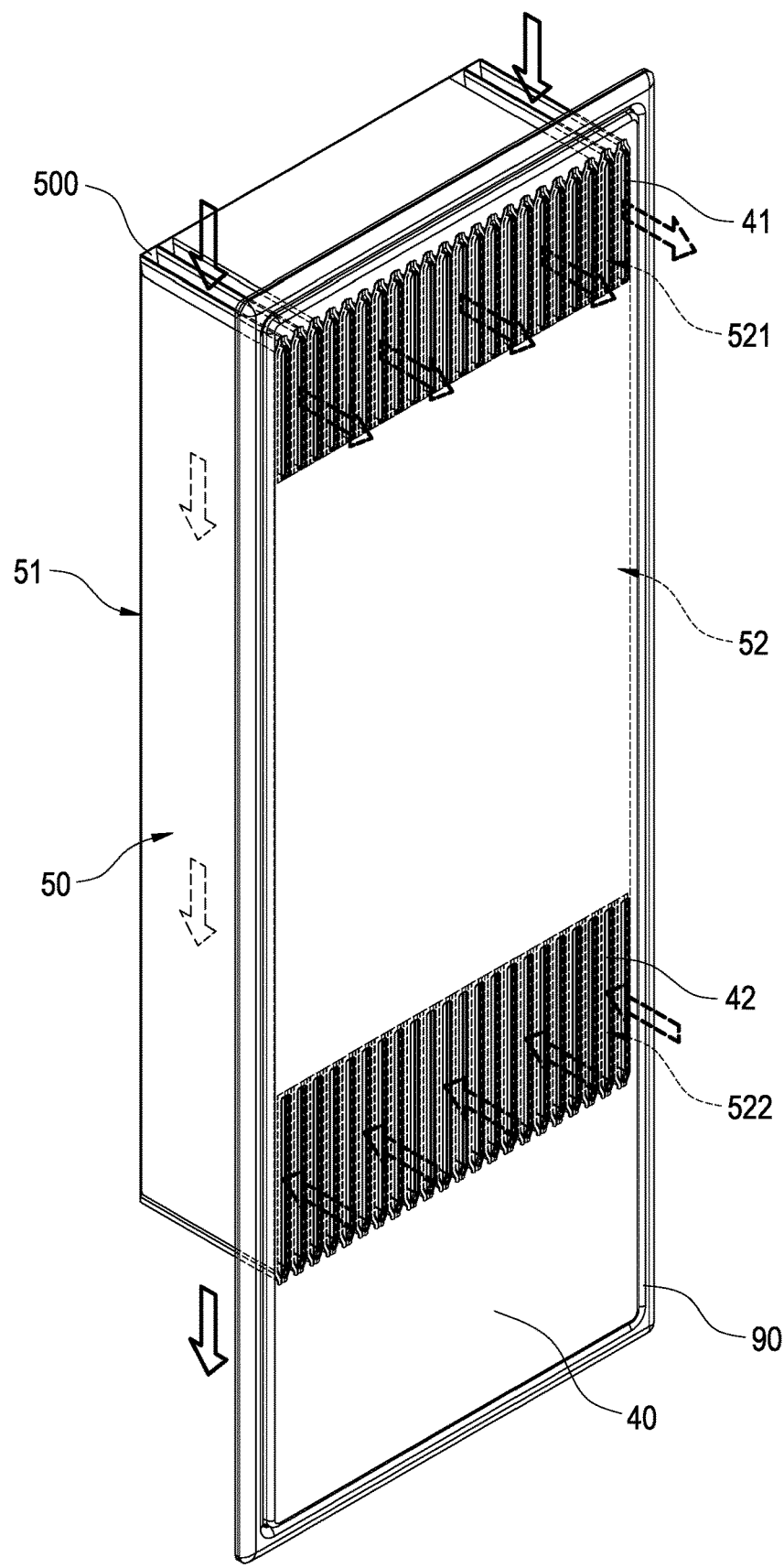
FIG. 4 is a schematic view of the assembly with heat dissipation pipes and partitions board of the telecommunication cabinet of this disclosure.

Please further refer to FIG. 4, it depicts a schematic view of the assembly with heat dissipation pipes and partitions board of the telecommunication cabinet of this disclosure. The heat dissipation pipes 50 are arranged spacedly and extended longitudinally, and a plurality of heat dissipation channels 500 are formed between each two adjacent heat dissipation pipes 50. In this embodiment, the heat dissipation pipes 50 have an open side 51 and a closed side 52 opposite to the open side 51. In other words, the open side 51 and the closed side 52 are defined on the heat dissipation pipes 50. The heat dissipation pipes 50 includes a plurality of upper nozzles 521 connected with the air vents 41 correspondingly and a plurality of lower nozzles 522 connected with the air intakes 42 correspondingly. Specifically, the upper nozzles 521 and the lower nozzles 522 are arranged on the open side 51 and respectively butt against the air vents 41 and the air intakes 42 to attach to the partition board 40. In this embodiment, each heat dissipation pipe 50 is a sealed pipe and includes an upper nozzle 521 and a lower nozzle 522 on two ends respectively.

It should be noted that the upper nozzles 521 butt against the air vents 41, so that the hot air enters the heat dissipation pipes 50 from the upper nozzles 521 may not flow into the second cabinet body 20. Similarly, the lower nozzles 522 butt against the air intakes 41, so that the hot air in the heat dissipation pipes 50 may not flow out from the second cabinet body 20.

It is worth noticing that the air flows into each heat dissipation pipe 50 from the lower nozzles 522 connected with the air intakes 42, flows out from the upper nozzles 521 connected to the air vents 41, and a flow path is formed in each heat dissipation pipe 50.

Specifically, the air vents 41 are arranged spacedly corresponding to the upper nozzles 521 of the heat dissipation pipes 50, and the air intakes 42 are arranged spacedly corresponding to the lower nozzles 522 of the heat dissipation pipes 50. Please refer to FIG. 3, the air vents 41 are located at the same height from bottom of the telecommunication cabinet 1 as the upper slot 12, and the air intakes 42 are located at the same height from bottom of the telecommunication cabinet 1 as the lower slot 13.

Therefore, the hot air in the first cabinet body 10 is expelled from the lower slot 13 and flows into the air intakes 42. Additionally, the air flowing out from the air vents 41 enters the upper slot 13 and flows into the first cabinet body 10.

Figure 5:
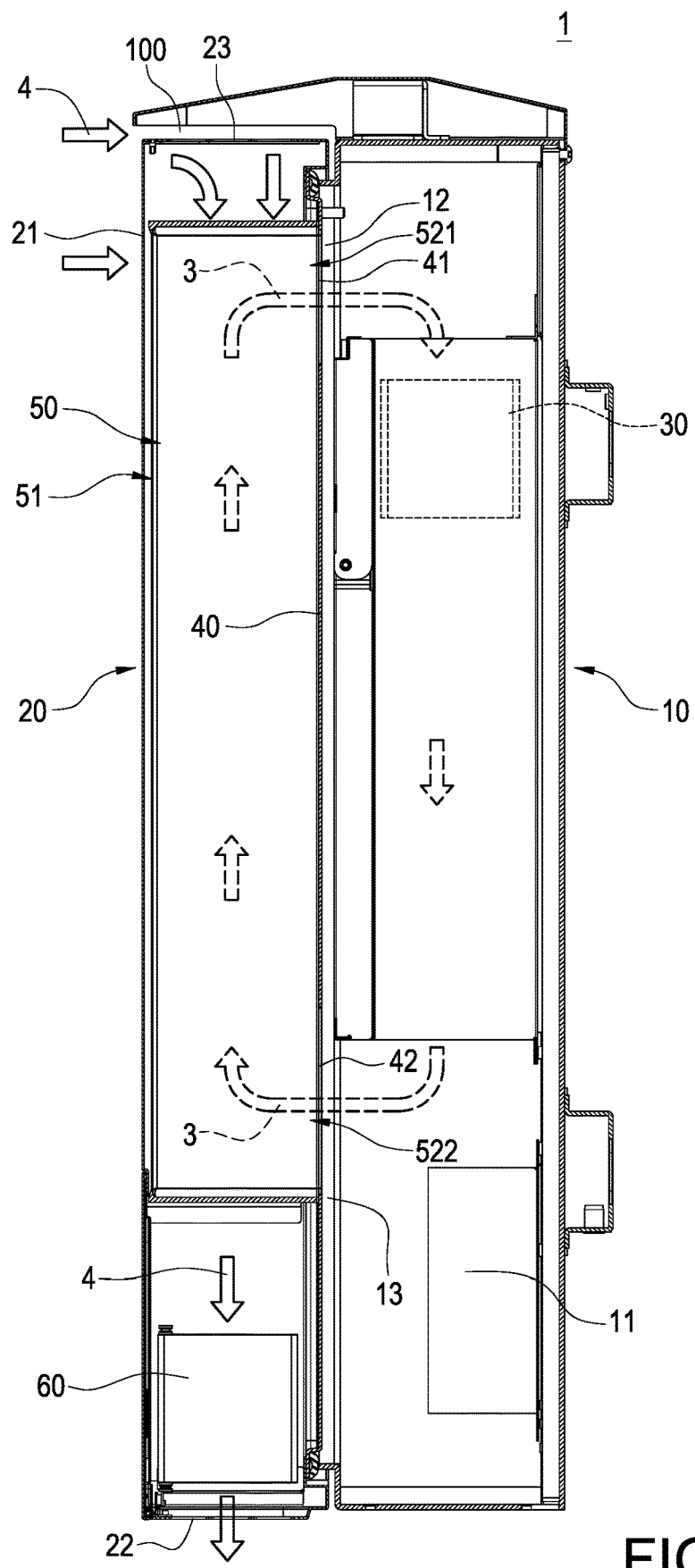
FIG. 5 is a schematic view of the heat exchange structure of the telecommunication cabinet in an operation status of this disclosure.

Please further refer FIG. 5, which depicts a schematic view of the heat exchange structure of the telecommunication cabinet in an operation status of this disclosure. When the telecommunication cabinet 1 of this disclosure is in operation, the telecommunication module 11 inside the first cabinet body 10 generates heat, thus the heat inside the first cabinet body 10 needs to be expelled for maintaining a normal operation.

In more detail, under the action of the internal fan 30, the hot air 3 in the first cabinet 10 flows out from the first cabinet body 10 through the upper slot 12 and passes through the air intakes 42 of the partition board 40 to enter the lower nozzles 522 of the heat dissipation pipes 50. In addition, the hot air 3 flows into each heat dissipation pipe 5 and performs heat exchange with the external air 4, flows out from the upper nozzle 521 and passes through the air vents 41 of the partition board 40, and enters the first cabinet body 10 through the upper slot 12. This is the circulation path of the hot air 3 inside the first cabinet body 10.

On the other hand, the external air 4 enters the second cabinet body 20 through the air inlet 21 under a forcible airflow of the external fan 50, or enters the second air inlets 23 through the gap 100 between the first cabinet body 10 and the second cabinet body 20 and flows into the second cabinet body 20. The external air 4 flows through the heat dissipation channels 500 (refer to FIG. 4) and performs heat exchange with the heat dissipation pipes 50. Therefore, the heat of the hot air 3 is taken away, and the external air 4 flows out from the second cabinet body 20 through the air vents 22. This is the circulation path of the external air 4 inside the second cabinet body 20.

It is worth noticing that since the hot air 3 and the external air 4 flow through the heat dissipation pipes 50 in a linear path, the air flows have no turning so as to reduce the air resistance. Therefore, the heat exchange efficiency and heat dissipation effect are improved.

It should be noted that the flowing path of the hot air 3 inside the first cabinet body 10 and the flowing path of the external air 4 inside the second cabinet body 20 are two independent paths that do not intervene with each other. Therefore, the first cabinet body 10 and the second cabinet body 20 may be isolated, so that the first cabinet body 10 may achieve the purpose of being dustproof and waterproof. In addition, a sealing ring 90 is coupled to a side of the second cabinet body 20 facing the first cabinet body 10 to maintain the air tightness between the first cabinet body 10 and the second cabinet body 20.

Figure 6:
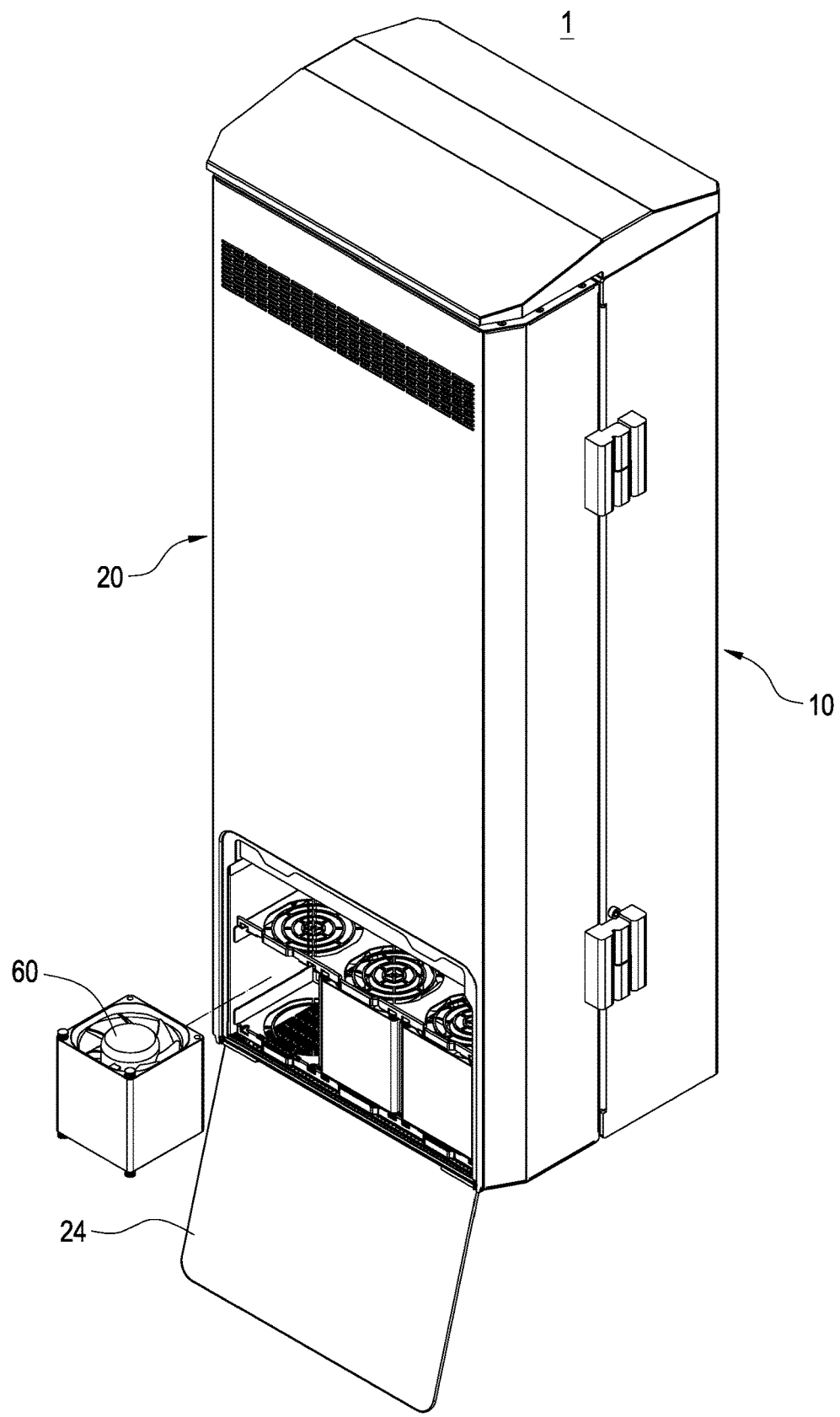
FIG. 6 and FIG. 7 are schematic views of the assembly with the external fans and the internal fans of the telecommunication cabinet of this disclosure.
Figure 7:
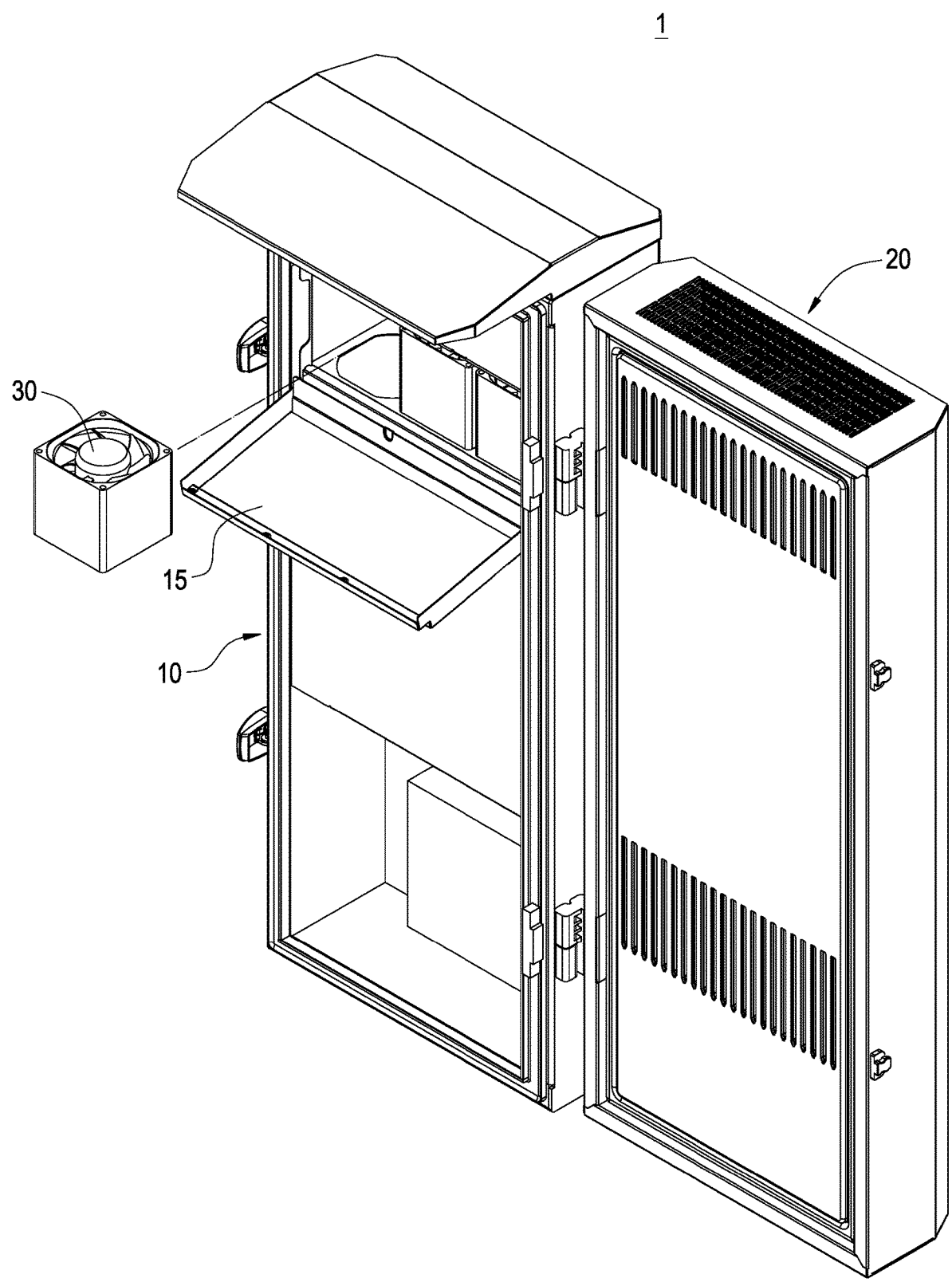

Please further refer to FIG. 6 and FIG. 7, which depict schematic views of the assembly of the external fans and the internal fans of this disclosure. As shown in FIG. 6, in this embodiment, an outer rotating door 24 is connected with an outer side of the second cabinet body 20, and the external fan 60 is placed into the second cabinet body 24 through opening the outer rotating door 24. Please refer to FIG. 7, in this embodiment, the first cabinet body 10 is connected with an internal rotating door 15, and the internal fan 30 is placed into the first cabinet body 10 through opening the internal rotating door 15. Therefore, the purpose of facilitating assembly and replacement are achieved to increase the convenience of use.

Although this disclosure has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A heat exchange structure of a telecommunication cabinet, the heat exchange structure comprising:
   a first cabinet body, comprising an upper slot and a lower slot;
   a second cabinet body, covering the first cabinet body, and comprising an air inlet and an air outlet;
   at least one internal fan, arranged in the first cabinet body and adjacent to the upper slot;
   a partition board, connected with the second cabinet body, blocking the first cabinet body from communicating with the second cabinet body and comprising a plurality of air vents and a plurality of air intakes, and the air vents arranged above the air intakes correspondingly;
   a plurality of heat dissipation pipes, disposed in the second cabinet body and arranged spacedly and extended longitudinally, and a plurality of heat dissipation channels disposed therebetween, and the heat dissipation pipes comprising a plurality of upper nozzles connected with the air vents correspondingly and a plurality of lower nozzles connected with the air intakes correspondingly; and
   at least one external fan, disposed on a bottom inside the second cabinet body;
   wherein, a hot air in the first cabinet body flows out from the first cabinet body through the lower slot under a forcible airflow of the internal fan, and enters the lower nozzles of the heat dissipation pipes through the air intakes of the partition board, the hot air flows out from the upper nozzles and passes through the air vents of the partition board after flowing through the heat dissipation pipes and performing heat exchange, and enters the first cabinet body through the upper slot, an external air enters the second cabinet body through the air inlet under a forcible airflow of the external fan, flows through the heat dissipation channels to perform heat exchange with the heat dissipation pipes, and flows out from the second cabinet body through the air outlet to an outside.

2. The heat exchange structure of the telecommunication cabinet according to claim 1, further comprising: a pair of brackets, connected on a rear side of the first cabinet body, and the telecommunication cabinet being attached through the pair of brackets.

3. The heat exchange structure of the telecommunication cabinet according to claim 1, wherein the first cabinet body comprises a convex plate disposed on a top thereof, and the convex plate is protruded to an upper side of the second cabinet body, and a gap is disposed between the convex plate and the second cabinet body.

4. The heat exchange structure of the telecommunication cabinet according to claim 3, wherein a plurality of second air inlets are disposed on a top surface of the second cabinet body, and the external air enters the second air inlets from the gap and flows into the second cabinet body.

5. The heat exchange structure of the telecommunication cabinet according to claim 1, wherein the first cabinet body is connected with an internal rotating door, and the at least one internal fan is disposed in the first cabinet body through the internal rotating door.

6. The heat exchange structure of the telecommunication cabinet according to claim 1, wherein an outer rotating door is connected on an outer side of the second cabinet body, and the external fan is disposed in the second cabinet body through the outer rotating door.

7. The heat exchange structure of the telecommunication cabinet according to claim 1, wherein the air vents are arranged spacedly corresponding to the upper nozzles of the heat dissipation pipes and located corresponding to the upper slot; the air intakes are arranged spacedly corresponding to the lower nozzles of the heat dissipation pipes and located corresponding to the lower slot.

8. The heat exchange structure of the telecommunication cabinet according to claim 1, wherein the heat dissipation pipes comprise an open side and a closed side opposite to the open side, and the upper nozzles and the lower nozzles are arranged on the open side and respectively butt against the air vents and the air intakes to attach to the partition board.

9. The heat exchange structure of the telecommunication cabinet according to claim 1, further comprising: a sealing ring, coupled to a side of the second cabinet body facing the first cabinet body.

\* \* \* \* \*